US010818751B2

(12) United States Patent
Ebrish et al.

(10) Patent No.: US 10,818,751 B2
(45) Date of Patent: Oct. 27, 2020

(54) NANOSHEET TRANSISTOR BARRIER FOR ELECTRICALLY ISOLATING THE SUBSTRATE FROM THE SOURCE OR DRAIN REGIONS

(71) Applicant: International Business Machines Corporation, Armonk, NY (US)

(72) Inventors: Mona A. Ebrish, Albany, NY (US); Fee Li Lie, Albany, NY (US); Nicolas Loubet, Guilderland, NY (US); Gauri Karve, Cohoes, NY (US); Indira Seshadri, Niskayuna, NY (US); Lawrence A. Clevenger, Saratoga Springs, NY (US); Leigh Anne H. Clevenger, Rhinebeck, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/290,165

(22) Filed: Mar. 1, 2019

(65) Prior Publication Data
US 2020/0279913 A1   Sep. 3, 2020

(51) Int. Cl.
| | |
|---|---|
| H01L 21/00 | (2006.01) |
| H01L 29/06 | (2006.01) |
| H01L 21/8234 | (2006.01) |
| H01L 21/02 | (2006.01) |
| H01L 29/66 | (2006.01) |
| H01L 29/08 | (2006.01) |
| H01L 29/165 | (2006.01) |

(Continued)

(52) U.S. Cl.
CPC .... *H01L 29/0642* (2013.01); *H01L 21/02532* (2013.01); *H01L 21/02603* (2013.01); *H01L 21/823412* (2013.01); *H01L 21/823431* (2013.01); *H01L 21/823437* (2013.01); *H01L 21/823468* (2013.01); *H01L 21/823481* (2013.01); *H01L 27/0886* (2013.01); *H01L 29/0673* (2013.01); *H01L 29/0847* (2013.01); *H01L 29/165* (2013.01); *H01L 29/66545* (2013.01); *H01L 29/66553* (2013.01); *H01L 29/66795* (2013.01); *H01L 29/7851* (2013.01)

(58) Field of Classification Search
CPC ........... H01L 29/0642; H01L 21/02603; H01L 21/823431
See application file for complete search history.

(56) References Cited

U.S. PATENT DOCUMENTS

| | | |
|---|---|---|
| 6,190,979 B1 | 2/2001 | Radens et al. |
| 7,253,060 B2 | 8/2007 | Yun et al. |

(Continued)

*Primary Examiner* — Laura M Menz
(74) *Attorney, Agent, or Firm* — Cantor Colburn LLP

(57) ABSTRACT

Embodiments of the invention are directed to a nanosheet field effect transistor (FET) device. A non-limiting example of the nanosheet FET device includes a stack of channel nanosheets over a substrate, along with a source or drain (S/D) trench in a predetermined region of the substrate. The predetermined region of the substrate includes a region over which a S/D region of the nanosheet FET is formed. The S/D region of the nanosheet FET is formed at ends of a bottom-most one of the stack of channel nanosheets. An isolation barrier is formed in the S/D trench. The isolation barrier is configured to substantially prevent the S/D region from being electrically coupled to the substrate.

18 Claims, 10 Drawing Sheets

(51) Int. Cl.
*H01L 29/78* (2006.01)
*H01L 27/088* (2006.01)

(56) References Cited

U.S. PATENT DOCUMENTS

| | | | |
|---|---|---|---|
| 8,216,902 B2 * | 7/2012 | Chang | B82Y 10/00 |
| | | | 257/E21.645 |
| 8,470,684 B2 | 6/2013 | Pei et al. | |
| 9,324,812 B2 | 4/2016 | Yang et al. | |
| 9,634,143 B1 * | 4/2017 | Wahl | H01L 21/823892 |
| 9,755,017 B1 | 9/2017 | Guillorn et al. | |
| 9,761,722 B1 | 9/2017 | Jagannathan et al. | |
| 9,847,391 B1 * | 12/2017 | Zang | H01L 29/0673 |
| 2013/0154007 A1 | 6/2013 | Cheng et al. | |
| 2014/0217502 A1 * | 8/2014 | Chang | H01L 29/861 |
| | | | 257/347 |
| 2015/0064854 A1 * | 3/2015 | Leobandung | H01L 29/66545 |
| | | | 438/157 |
| 2015/0137237 A1 | 5/2015 | Jacob et al. | |
| 2015/0333167 A1 * | 11/2015 | Leobandung | H01L 29/0673 |
| | | | 257/347 |
| 2019/0140080 A1 * | 5/2019 | Lee | H01L 29/41741 |
| 2019/0157161 A1 * | 5/2019 | Balakrishnan | H01L 29/7827 |
| 2019/0341300 A1 * | 11/2019 | Glass | H01L 21/76831 |

\* cited by examiner

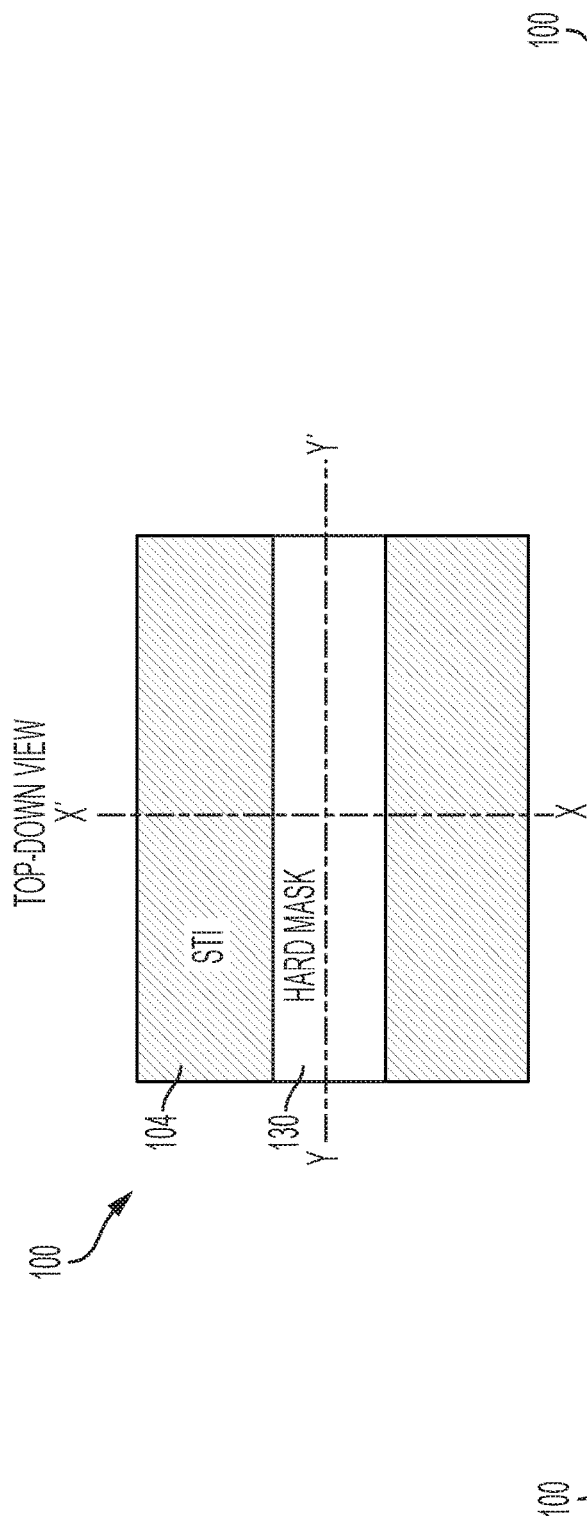
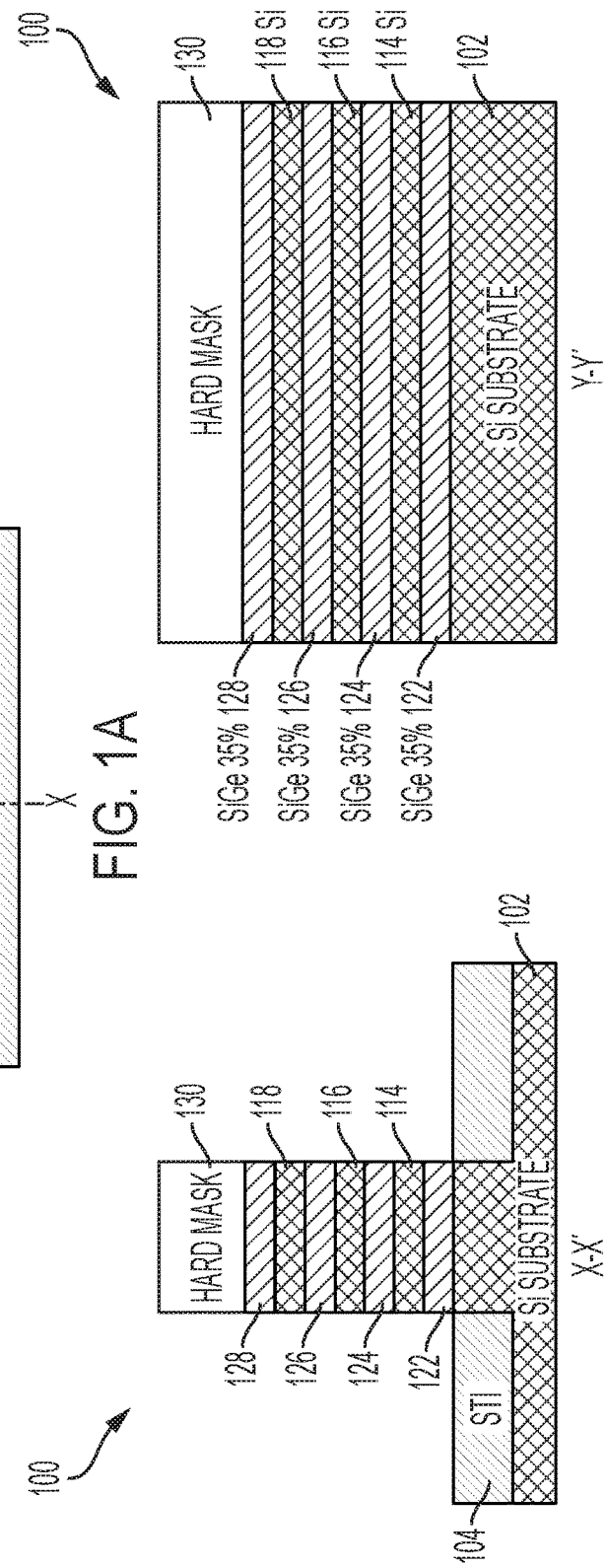
FIG. 1A
FIG. 1B
FIG. 1C

NANOSHEET TRANSISTOR BARRIER FOR ELECTRICALLY ISOLATING THE SUBSTRATE FROM THE SOURCE OR DRAIN REGIONS

BACKGROUND

The present invention relates in general to fabrication methods and resulting structures for semiconductor devices. More specifically, the present invention relates to fabrication methods and resulting structures for nanosheet transistor barrier schemes configured and arranged to electrically isolate the transistor substrate such that unwanted leakage currents from the source or drain (S/D) region into the substrate are substantially prevented.

In contemporary semiconductor device fabrication processes, a large number of semiconductor devices, such as n-type field effect transistors (nFETs) and p-type field effect transistors (pFETs), are fabricated on a single wafer. Non-planar transistor device architectures, such as nanosheet (or nanowire) transistors, can provide increased device density and increased performance over planar transistors. Nanosheet transistors, in contrast to conventional planar field effect transistors (FETs), include a gate stack that wraps around the full perimeter of multiple nanosheet channel regions for improved control of channel current flow. The S/D regions are formed at the ends of each nanosheet channel region, typically using an epitaxial growth process.

SUMMARY

Embodiments of the invention are directed to a method of fabricating a nanosheet FET. A non-limiting example of the method includes forming a stack of channel nanosheets over a substrate, along with forming a S/D trench in a predetermined region of the substrate. The predetermined region of the substrate includes a region over which a S/D region of the nanosheet FET will be formed. The S/D region of the nanosheet FET will be formed at ends of a bottom most one of the stack of channel nanosheets. An isolation barrier is formed in the S/D trench. The isolation barrier is configured to substantially prevent the S/D region from being electrically coupled to the substrate. In embodiments of the invention, the isolation barrier is also configured to substantially prevent creating a current path between one S/D region and another S/D region passing beneath the stack of channel nanosheets.

Embodiments of the invention are directed to a nanosheet FET device. A non-limiting example of the nanosheet FET device includes a stack of channel nanosheets over a substrate, along with a S/D trench in a predetermined region of the substrate. The predetermined region of the substrate includes a region over which a S/D region of the nanosheet FET is formed. The S/D region of the nanosheet FET is formed at ends of a bottommost one of the stack of channel nanosheets. An isolation barrier is formed in the S/D trench. The isolation barrier is configured to substantially prevent the S/D region from being electrically coupled to the substrate.

Additional features and advantages are realized through techniques described herein. Other embodiments and aspects are described in detail herein. For a better understanding, refer to the description and to the drawings.

BRIEF DESCRIPTION OF THE DRAWINGS

The subject matter which is regarded as embodiments is particularly pointed out and distinctly claimed in the claims at the end of the specification. The foregoing and other features and advantages of the embodiments are apparent from the following detailed description taken in conjunction with the accompanying drawings in which:

FIGS. 1A-9 depict various views of nanosheet-based structures after fabrication operations for forming nanosheet FETs having a barrier scheme for electrically isolating the substrate from the S/D regions in accordance with aspects of the invention, in which:

FIG. 1A depicts a top-down view of a nanosheet-based structure after initial fabrication operations in accordance with embodiments of the invention;

FIG. 1B depicts a cross-sectional view of the nanosheet-based structure shown in FIG. 1A taken along line X-X';

FIG. 1C depicts a cross-sectional view of the nanosheet-based structure shown in FIG. 1A taken along line Y-Y';

FIG. 3 depicts a cross-sectional view of the nanosheet-based structure shown in FIG. 1A taken along line Y-Y';

FIG. 4 depicts a cross-sectional view of the nanosheet-based structure taken along line Y-Y' after fabrication operations in accordance with embodiments of the invention;

FIG. 5 depicts a cross-sectional view of the nanosheet-based structure taken along line Y-Y' after fabrication operations in accordance with embodiments of the invention;

FIG. 6 depicts a cross-sectional view of the nanosheet-based structure taken along line Y-Y' after fabrication operations in accordance with embodiments of the invention;

FIG. 7 depicts a cross-sectional view of the nanosheet-based structure taken along line Y-Y' after fabrication operations in accordance with embodiments of the invention;

FIG. 8 depicts a cross-sectional view of the nanosheet-based structure taken along line Y-Y' after fabrication operations in accordance with embodiments of the invention; and FIG. 9 depicts a cross-sectional view of the nanosheet-based structure taken along line Y-Y' after fabrication operations in accordance with embodiments of the invention;

FIGS. 10-11 depict various views of nanosheet-based structures after fabrication operations for forming nanosheet FETs having a barrier scheme for electrically isolating the substrate from the S/D regions in accordance with aspects of the invention, in which:

FIG. 10 depicts a cross-sectional view of the nanosheet-based structure taken along line Y-Y' after fabrication operations in accordance with embodiments of the invention; and FIG. 11 depicts a cross-sectional view of the nanosheet-based structure taken along line Y-Y' after fabrication operations in accordance with embodiments of the invention.

DETAILED DESCRIPTION

Figure 2A:
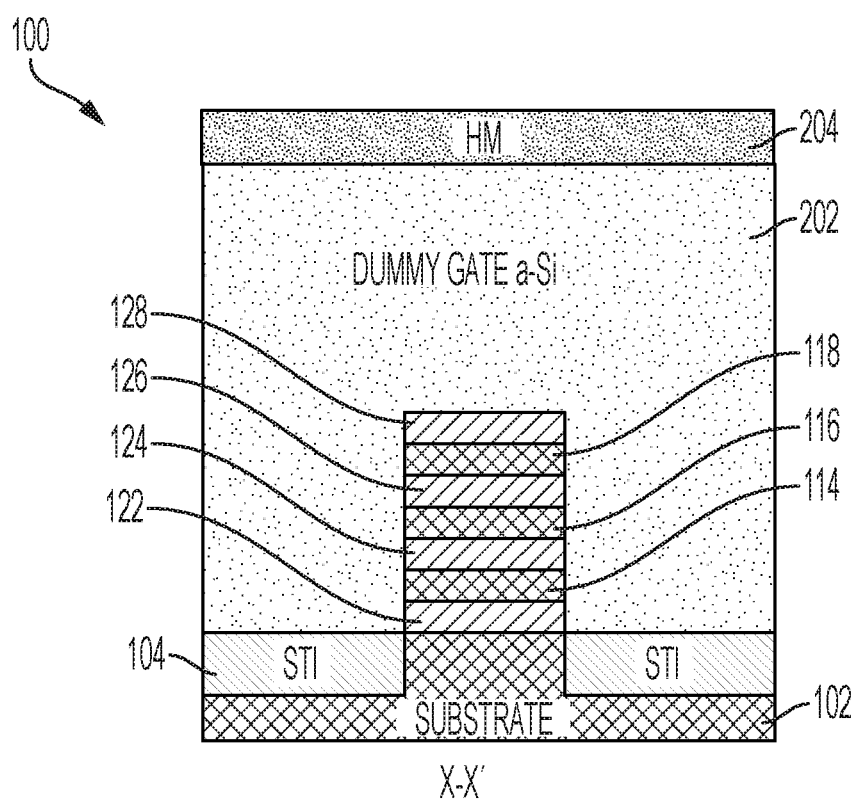
FIG. 2A depicts a cross-sectional view of the nanosheet-based structure shown in FIG. 1A taken along line X-X'.

It is understood in advance that although this invention includes a detailed description of exemplary gate-all-around (GAA) nanosheet FET architectures having silicon (Si) channel nanosheets and SiGe sacrificial nanosheets, embodiments of the invention are not limited to a particular FET architecture or material described in this specification. Rather, embodiments of the present invention are capable of being implemented in conjunction with any other type of nanosheet/nanowire FET architecture or materials now known or later developed.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In the interest of brevity and because many steps in the manufacture of semiconductor devices and semiconductor-based ICs are well known, these steps will either be only mentioned briefly herein or will be omitted entirely without providing the well-known process details.

Turning now to a description of technologies that are more specifically relevant to the present invention, transistors are semiconductor devices commonly found in a wide variety of ICs. A transistor is essentially a switch. When a voltage is applied to a gate of the transistor that is greater than a threshold voltage, the switch is turned on, and current flows through the transistor. When the voltage at the gate is less than the threshold voltage, the switch is off, and current does not flow through the transistor.

Typical semiconductor devices are formed using active regions of a wafer. The active regions are defined by isolation regions used to separate and electrically isolate adjacent semiconductor devices. For example, in an IC having a plurality of metal oxide semiconductor field effect transistors (MOSFETs), each MOSFET has a source and a drain that are formed in an active region of a semiconductor layer by implanting n-type or p-type impurities in the layer of semiconductor material. Disposed between the source and the drain is a channel (or body) region. Disposed above the body region is a gate electrode. The gate electrode and the body are spaced apart by a gate dielectric layer.

MOSFET-based ICs are fabricated using so-called complementary metal oxide semiconductor (CMOS) fabrication technologies. In general, CMOS is a technology that uses complementary and symmetrical pairs of p-type and n-type MOSFETs to implement logic functions. The channel region connects the source and the drain, and electrical current flows through the channel region from the source to the drain. The electrical current flow is induced in the channel region by a voltage applied at the gate electrode.

The wafer footprint of an FET is related to the electrical conductivity of the channel material. If the channel material has a relatively high conductivity, the FET can be made with a correspondingly smaller wafer footprint. A known method of increasing channel conductivity and decreasing FET size is to form the channel as a nanostructure. For example, a so-called gate-all-around (GAA) nanosheet FET is a known architecture for providing a relatively small FET footprint by forming the channel region as a series of nanosheets. In a known GAA configuration, a nanosheet-based FET includes a source region, a drain region and stacked nanosheet channels between the source and drain regions. The stacked nanosheet channels are spaced apart from one another, and a gate surrounds the spaced apart and stacked nanosheet channels to regulate electron flow through the nanosheet channels between the source and drain regions.

GAA nanosheet FETs can be fabricated by forming alternating layers of channel nanosheets and sacrificial nanosheets. The sacrificial nanosheets are released from the channel nanosheets before the FET device is finalized. For n-type FETs, the channel nanosheets are typically silicon (Si) and the sacrificial nanosheets are typically silicon germanium (SiGe). For p-type FETs, the channel nanosheets can be SiGe and the sacrificial nanosheets can be Si. In some implementations, the channel nanosheet of a p-type FET can be SiGe or Si, and the sacrificial nanosheets can be Si or SiGe. Forming the GAA nanosheets from alternating layers of channel nanosheets formed from a first type of semiconductor material (e.g., Si for n-type FETs, and SiGe for p-type FETs) and sacrificial nanosheets formed from a second type of semiconductor material (e.g., SiGe for n-type FETs, and Si for p-type FETs) provides superior channel electrostatics control, which is necessary for continuously scaling gate lengths down to seven (7) nanometer CMOS technology and below. The use of multiple layered SiGe/Si sacrificial/channel nanosheets (or Si/SiGe sacrificial/channel nanosheets) to form the channel regions in GAA FET semiconductor devices provides desirable device characteristics, including the introduction of strain at the interface between SiGe and Si.

As previously noted herein, the S/D regions of GAA nanosheet FET are formed at the ends of each nanosheet channel region, typically using an epitaxial growth process. For the bottommost nanosheet channel region, the S/D regions formed at the ends thereof can be sufficiently close to the substrate to result in unwanted leakage currents flowing from the S/D region into the substrate.

Turning now to an overview of aspects of the invention, embodiments of the invention provide fabrication methods and resulting structures for nanosheet transistor barrier schemes configured and arranged to electrically isolate the transistor substrate such that unwanted leakage currents from the S/D region into the substrate are substantially prevented. FIGS. 1A-9 depict nanosheet-based structures 100 after various fabrication operations for forming nanosheet FETs having a barrier scheme for electrically isolating the substrate 102 from the S/D regions 1102 in accordance with aspects of the invention. In embodiments of the invention as represented by the nanosheet-based structures 100, the electrically isolating barrier is provided by regions of counter-doped semiconductor material formed in regions of the substrate 102 over which the bottommost S/D regions will be formed. The barrier regions are counter-doped in that the majority charge carriers in the barrier region semiconductor material are the opposite of the majority carriers in the S/D regions of the final nanosheet FET. In other words, if the S/D regions in the final nanosheet FET are doped such that the S/D regions are p-type, the barrier region semiconductor material is doped such that the barrier region semiconductor material is n-type. Likewise, if the S/D regions in the final nanosheet FET are doped such that the S/D regions are n-type, the barrier region semiconductor material is doped such that the barrier region semiconductor material is p-type. Accordingly, the counter-doped barrier regions are configured and arranged to electrically isolate the transistor substrate such that unwanted leakage currents from the S/D regions into the substrate are substantially prevented. In embodiments of the invention, the barrier regions can be fabricated by forming trenches in the regions of the substrate over which the bottommost S/D regions will be formed. The trenches are filled with the counter-doped semiconductor material to form the barrier regions. In embodiments of the invention, the counter-doped semiconductor material can be fabricated using an epitaxial growth process with in-situ doping.

Figure 9:
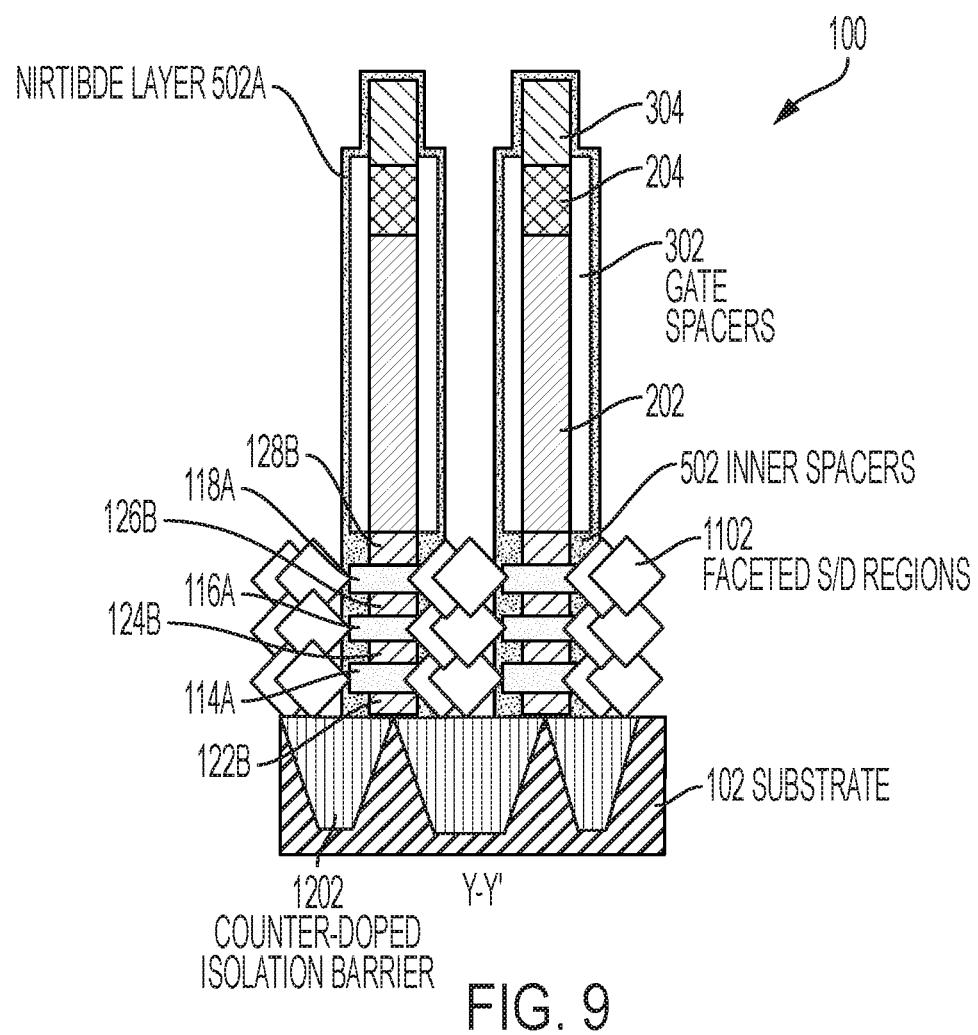
Figure 11:
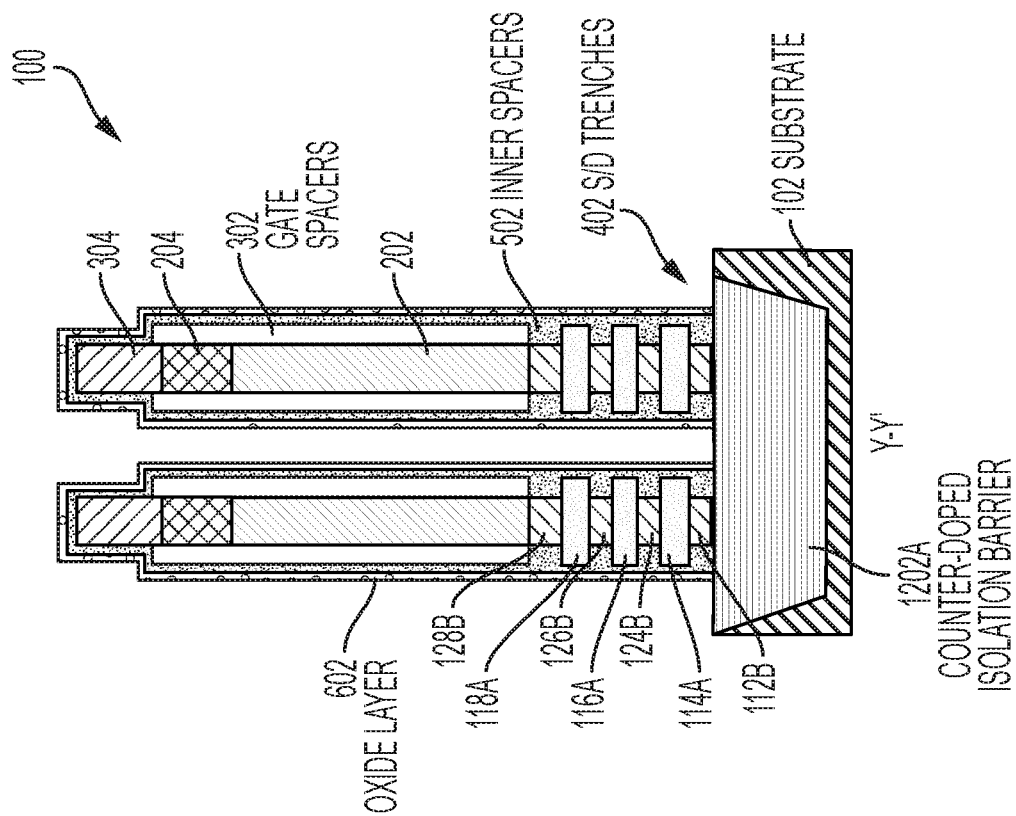
Figure 10:
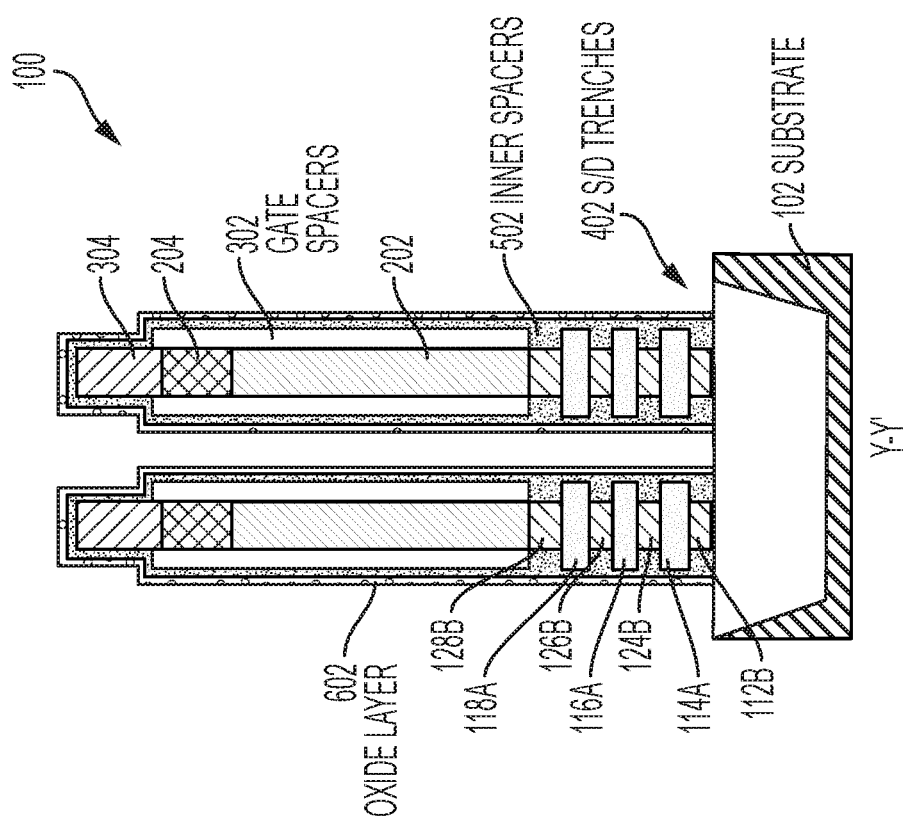

FIGS. 10-11 depict nanosheet-based structures 100A after various fabrication operations for forming nanosheet FETs having a barrier scheme for electrically isolating the substrate 102 from the S/D regions 1102 (shown in FIG. 9) in accordance with aspects of the invention. In embodiments of the invention as represented by the nanosheet-based structures 100A, the barrier is provided by a single region of counter-doped semiconductor material formed in the region of the substrate over which the bottommost channel nanosheet and S/D regions will be formed. The barrier region is counter-doped in that the majority charge carriers in the barrier region semiconductor material are the opposite of the majority carriers in the S/D regions of the final nanosheet FET. In other words, if the S/D regions in the final nanosheet FET are doped such that the S/D regions are p-type, the barrier region semiconductor material is doped such that the barrier region semiconductor material is n-type. Likewise, if the S/D regions in the final nanosheet FET are doped such that the S/D regions are n-type, the barrier region semiconductor material is doped such that the barrier region semiconductor material is p-type. Accordingly, the counter-doped barrier region is configured and arranged to electrically isolate the transistor substrate such that unwanted leakage currents from the S/D regions into the substrate are substantially prevented. In embodiments of the invention, the single barrier region can be fabricated by forming a single trench in a region of the substrate over which the bottommost nanosheet channel and S/D regions will be formed. The trench is filled with the counter-doped semiconductor material to form the single barrier region. In embodiments of the invention, the counter-doped semiconductor material can be fabricated using an epitaxial growth process with in-situ doping.

Figure 12:
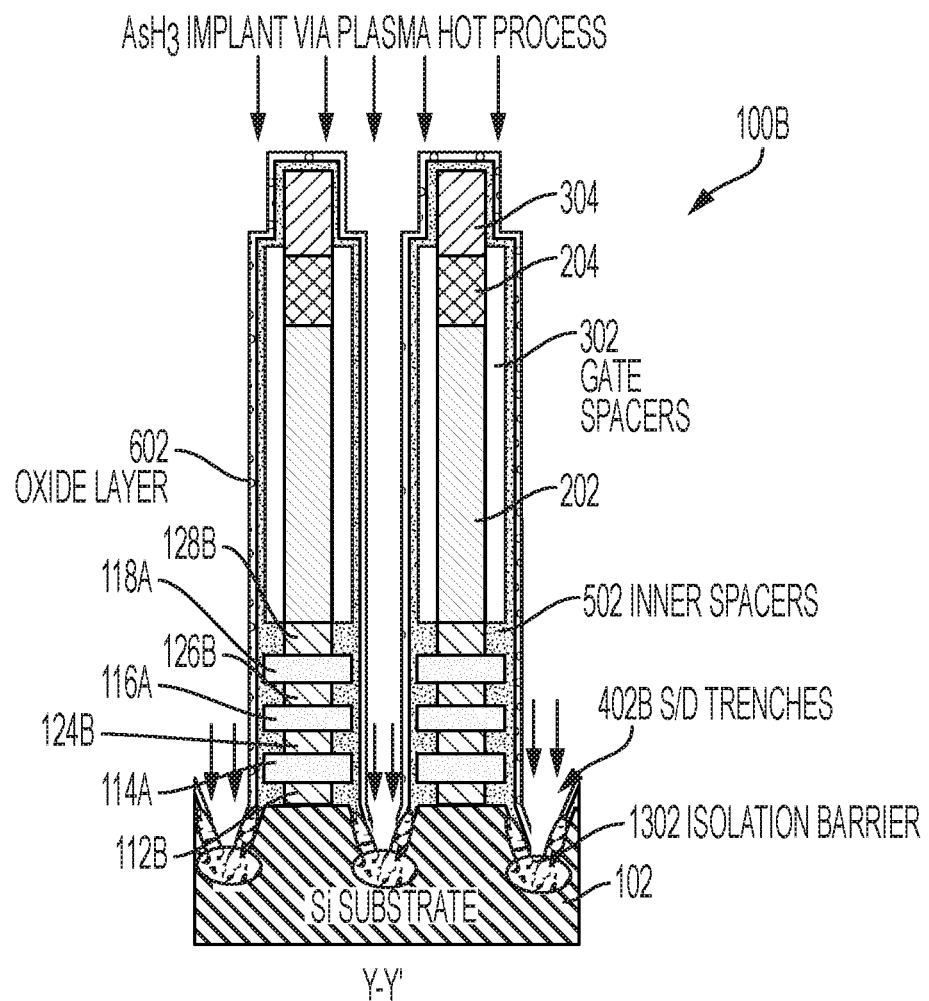
FIG. 12 depicts a cross-sectional view, taken along line Y-Y', of nanosheet-based structures after various fabrication operations for forming nanosheet FETs having a barrier scheme for electrically isolating the substrate from the S/D regions in accordance with aspects of the invention.

FIG. 12 depicts a nanosheet-based structures 100B after various fabrication operations for forming nanosheet FETs having a barrier scheme for electrically isolating the substrate 102 from the S/D regions 1102 (shown in FIG. 9) in accordance with aspects of the invention. In embodiments of the invention as represented by the nanosheet-based structure 100B, the barrier is provided by a doped isolation region formed on sidewalls of trenches formed in the substrate.

Turning now to a more detailed description of the fabrication methodologies illustrated by FIGS. 1A-9, FIG. 1A depicts a top-down view of the nanosheet-based structure 100 after initial fabrication operations in accordance with aspects of the present invention. FIG. 1B depicts a cross-sectional view of the nanosheet-based structure 100 taken along line X-X' shown in FIG. 1A, and FIG. 1C depicts a cross-sectional view of the nanosheet-based structure 100 taken along line Y-Y' shown in FIG. 1A. As best shown in FIG. 1B, known fabrication operations have been used to fabricate the nanosheet-based structure 100 to include a substrate 102, shallow trench isolation (STI) regions 104 formed over the substrate 102, a fin-shaped elongated stack of alternating sacrificial nanosheets 122, 124, 126, 128 and channel nanosheets 114, 116, 118 formed over the substrate, and a hard mask 130 formed over the sacrificial channel nanosheet 128.

The sacrificial nanosheets 122, 124, 126, 128 and channel nanosheets 114, 116, 118 can be a semiconductor material, where the material of the channel nanosheets 114, 116, 118 can function as a device channel, and the material of the sacrificial nanosheets 122, 124, 126, 128 can be selectively etched relative to the material of the channel nanosheets 114, 116, 118. In embodiments of the invention, the channel nanosheets 114, 116, 118 can be silicon (Si), silicon-germanium (SiGe), or an intrinsic semiconductor. In embodiments of the invention, the sacrificial nanosheets 122, 124, 126, 128 can be silicon (Si) or silicon-germanium (SiGe), where the sacrificial nanosheets 122, 124, 126, 128 can be the opposite material from the channel nanosheets 114, 116, 118. In a non-limiting exemplary embodiment of the invention depicted in FIGS. 1A-10, the channel nanosheets 114, 116, 118 are silicon (Si) and the sacrificial nanosheets 122, 124, 126, 128 are silicon-germanium (SiGe), which allows the sacrificial nanosheets 122, 124, 126, 128 to be selectively etched. In the non-limiting example depicted in FIGS. 1A-10, the SiGe sacrificial nanosheet layers 122, 124, 126, 128 can be SiGe 35%. The notation "SiGe 35%" is used to indicate that 35% of the SiGe material is Ge, and 75% of the SiGe material is Si. In a non-limiting exemplary embodiment of the invention depicted in FIGS. 1A-10, the sacrificial nanosheets 122, 124, 126, 128 are silicon-germanium ($Si_xGe_{1-x}$), where the germanium concentration can be about 30% to about 80%, or about 60%. In another non-limiting exemplary embodiment of the invention, the channel nanosheets can be silicon-germanium ($Si_xGe_{1-x}$), and the sacrificial nanosheets 122, 124, 126, 128 can be silicon (Si). In various embodiments of the invention, the channel nanosheets 114, 116, 118 can be the same material as the substrate 102.

In embodiments of the invention, the sacrificial nanosheets 122, 124, 126, 128 can have a thickness in a range of about 3 nm to about 20 nm, or in the range of about 10 nm to about 15 nm, or about 10 nm, although other thicknesses are also contemplated. In embodiments of the invention, the channel nanosheets 114, 116, 118 can have a thickness in a range of about 2 nm to about 10 nm, or in the range of about 3 nm to about 7 nm, or about 5 nm, although other thicknesses are also contemplated.

In embodiments of the invention, the structure 100 shown in FIG. 1B can be fabricated by growing alternating sacrificial layers and channel layers over the substrate 102. In embodiments of the invention, the alternating nanosheet layers depicted are formed by epitaxially growing one layer then the next until the desired number and desired thicknesses of the nanosheet layers are achieved. Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor.

In embodiments of the invention, the substrate 102 can be a semiconductor-on-insulator (SOI) substrate with an active semiconductor surface layer or a semiconductor substrate (e.g., single crystal silicon wafer). In some embodiments of the invention, the substrate 102 can be a single crystal silicon (Si) or silicon germanium (SiGe), wafer, or have a single crystal silicon (Si) or silicon germanium (SiGe) surface/active layer. The substrate 102 can include crystalline, semi-crystalline, microcrystalline, or amorphous portions. The substrate 102 can be essentially (i.e., except for contaminants) a single element (e.g., silicon), primarily (i.e., with doping) of a single element, for example, silicon (Si) or germanium (Ge), or the substrate can include a compound, for example, $Al_2O_3$, $SiO_2$, SiC, or SiGe.

In embodiments of the invention, a patterned hard mask (not shown) is deposited over the alternating nanosheet layers. The pattern of the hard mask defines the footprints of the hard mask 130 and the fin-shaped elongated stack of alternating sacrificial nanosheets 122, 124, 126, 128 and channel nanosheets 114, 116, 118. An etch (e.g., an RIE) or a recess is applied to remove the portions of the alternating nanosheet layers that are not covered by the patterned hard mask, thereby forming the hard mask 130 and the fin-shaped elongated stack of alternating sacrificial nanosheets 122, 124, 126, 128 and channel nanosheets 114, 116, 118. The etch/recess also defines a trench (not shown) in which the STI regions 104 are formed. In embodiments of the invention, the substrate 102 is Si, the STI regions 104 are an oxide, the sacrificial nanosheets 122, 124, 126, 128 are SiGe, the channel nanosheets 114, 116, 118 are Si, and the hard mask 130 is a nitride.

Figure 2B:
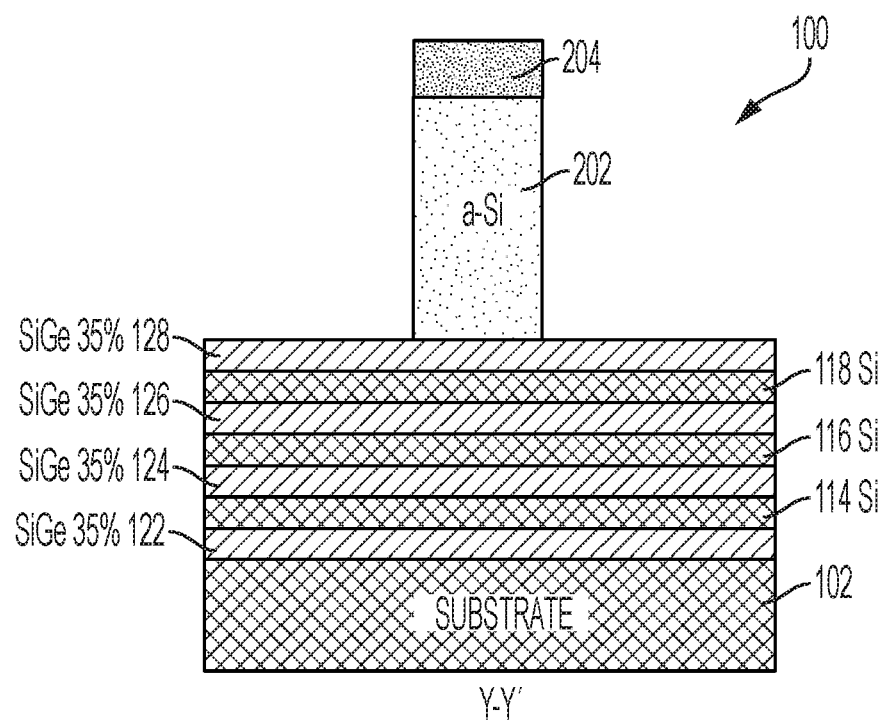
FIG. 2B depicts a cross-sectional view of the nanosheet-based structure shown in FIG. 1A taken along line Y-Y'.

FIG. 2A depicts a cross-sectional view of the nanosheet-based structure 100 taken along line X-X' shown in FIG. 1A, and FIG. 2B depicts a cross-sectional view of the nanosheet-based structure 100 taken along line Y-Y' shown in FIG. 1A. As best shown in FIG. 2A, known fabrication operations have been used to form a hard mask (HM) or cap 204 and a dummy gate 202 that extends over and around the fin-shaped elongated stack of alternating sacrificial nanosheets 122, 124, 126, 128 and channel nanosheets 114, 116, 118. In embodiments of the invention, the dummy gate 202 can be a material that can be easily and selectively removed from the topmost channel nanosheet 116, including, but not limited to, poly-silicon (p-Si), amorphous silicon (a-Si), amorphous carbon (a-C), silicon oxide (SiO), silicon nitride (SiN), silicon oxynitride (SiON), and combinations thereof. In the non-limiting example depicted in FIGS. 2A-10, the dummy gate 202 is a-Si. The dummy gate 202 can be formed by depositing a-Si over and around the fin-shaped elongated stack of alternating sacrificial nanosheets 122, 124, 126, 128 and channel nanosheets 114, 116, 118. The a-Si is then planarized to a desired level. A hard mask layer (not shown) is deposited over the planarized a-Si and patterned to form the hard mask 204. In embodiments of the invention, the hard mask 204 can be formed from a nitride (e.g., SiN). An etching process (e.g., an RIE) is applied to the a-Si to form the dummy gate 202. The hard mask 204 defines the footprint of the dummy gate 202.

Figure 3:
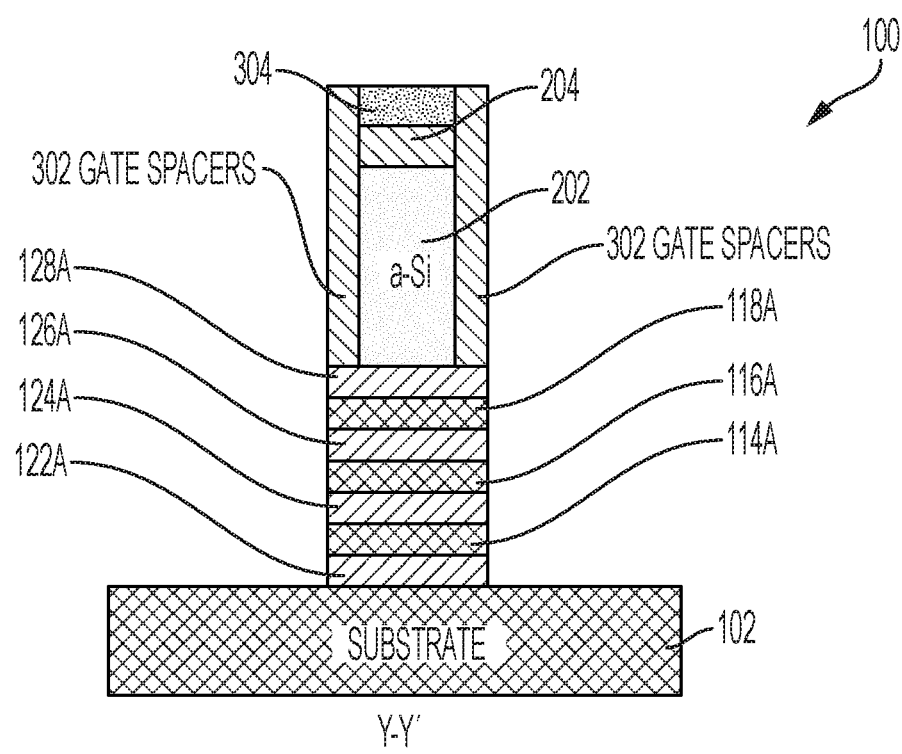

FIG. 3 depicts a cross-sectional view of the nanosheet-based structure 100 taken along line Y-Y' shown in FIG. 1A. As shown in FIG. 3, known fabrication operations have been used to form a hard mask (HM) or cover 304. In embodiments of the invention, the hard mask or cover 304 can be formed from an oxide (e.g., $SiO_2$). Known semiconductor fabrication operations have also been used to form offset gate spacers 302. In embodiments of the invention, the offset gate spacers 302 can be formed using a spacer pull down formation process. The offset gate spacers 302 can also be formed by a conformal deposition of a low-k dielectric material (e.g., silicon oxide, silicon nitride, silicon oxynitride, SiBCN, SiOCN, SiOC, or any suitable combination of those materials) followed by a directional etch (e.g., RIE).

In FIG. 3, known semiconductor fabrication operations (e.g., a recess or an etch) have been applied to the fin-shaped elongated stack of alternating sacrificial nanosheets 122, 124, 126, 128 and channel nanosheets 114, 116, 118 (shown in FIGS. 2A and 2B) to form a column-shaped stack of alternating sacrificial nanosheets 122A, 124A, 126A, 128A and channel nanosheets 114A, 116A, 118A. The offset gate spacers 302 define a portion of the footprint of the column-shaped stack of alternating sacrificial nanosheets 122A, 124A, 126A, 128A and channel nanosheets 114A, 116A, 118A.

Figure 4:
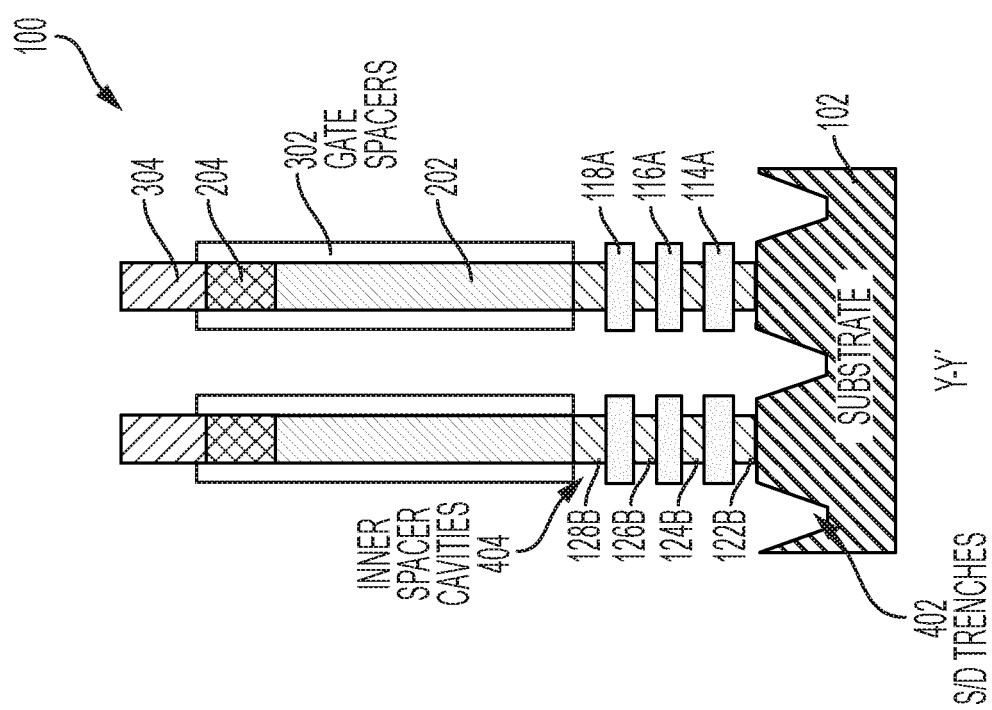

The diagrams shown in FIGS. 4-10 are taken along line Y-Y' of the structure 100 shown in FIG. 1A. Also, the diagrams shown in FIGS. 4-10 depict multiples instances of structures that will become a final nanosheet FET formed in accordance with aspects of the invention. In FIG. 4, known semiconductor fabrication operations have been used to partially remove end regions of the sacrificial nanosheets 122A, 124A, 126A, 128A (shown in FIG. 3) to form sacrificial nanosheets 122B, 124B, 126B, 128B having inner spacer cavities 404. For example, the end regions of the sacrificial nanosheets 122A, 124A, 126A, 128A can be removed using a so-called "pull-back" process to pull the sacrificial nanosheets 122A, 124A, 126A, 128A back an initial pull-back distance such that their end regions terminate underneath the offset gate spacers 302. In embodiments of the invention, the pull-back process includes a hydrogen chloride (HCL) gas isotropic etch process, which etches the sacrificial nanosheet material (e.g., SiGe) without attacking the channel nanosheet material (e.g., Si).

As also shown in FIG. 4, and in accordance with aspects of the invention, exposed portions of the substrate 102 have been removed to form trenches or recesses 402 in regions of the substrate surface over which the bottommost S/D regions of the final nanosheet FET will be formed. As the trenches 402 are positioned in areas of the substrate 102 over which the bottommost S/D regions will be formed, the trenches 402 are referred to herein as S/D trenches 402. The trenches 402 can be formed by a directional etch (e.g., RIE). The RIE process can be controlled to form trenches 402 with faceted inner trench walls that substantially match the faceted outer walls of the S/D regions that will be formed at ends of the bottommost channel nanosheet 114A. In embodiments of the invention, the inner walls of the S/D trenches 402 are (111) faceted. In embodiments of the invention, the deepest portion of each of the S/D trenches 402 can be about 15 nm.

Figure 5:
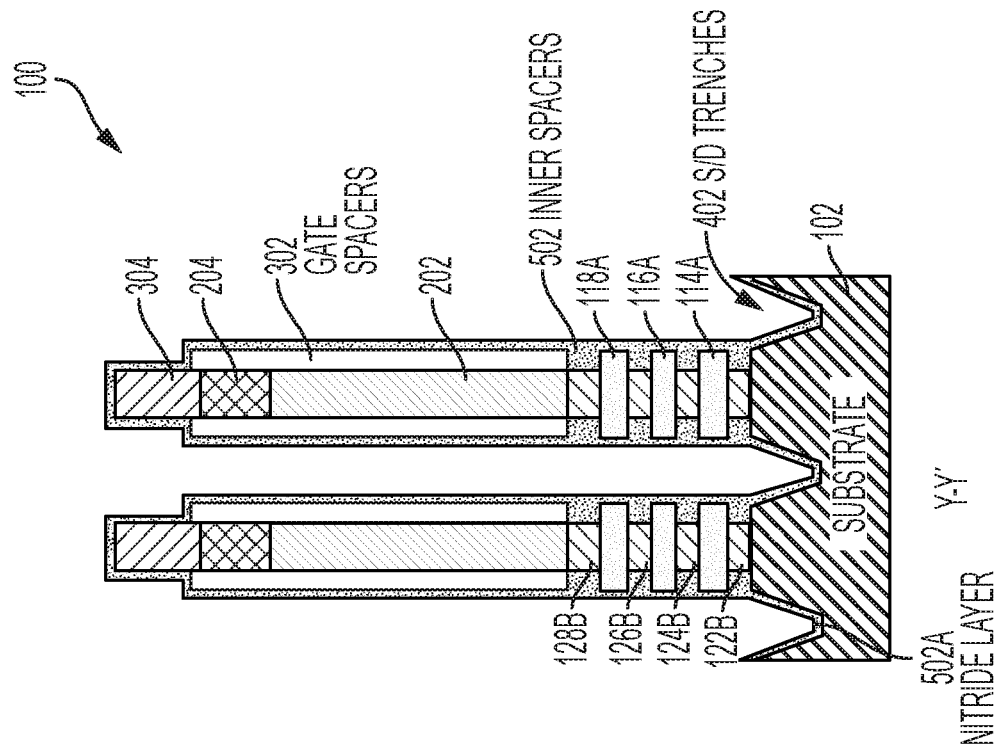

In FIG. 5, known semiconductor fabrication processes have been used to form inner spacers 502 in the end regions inner spacer cavities 404. In embodiments of the invention, the inner spacers 502 can be formed by depositing a layer of nitride 502A conformally over the structure 100 (including S/D trenches 402) using, for example, CVD or monolayer doping (MLD) followed by an inner spacer RIE. The inner spacers 502 can be formed from a nitride containing material (e.g., silicon nitride (SiN)), which prevents excess gauging during subsequent RIE processes (e.g., sacrificial nanosheet removal) that are applied during the semiconductor device fabrication process.

Figure 6:
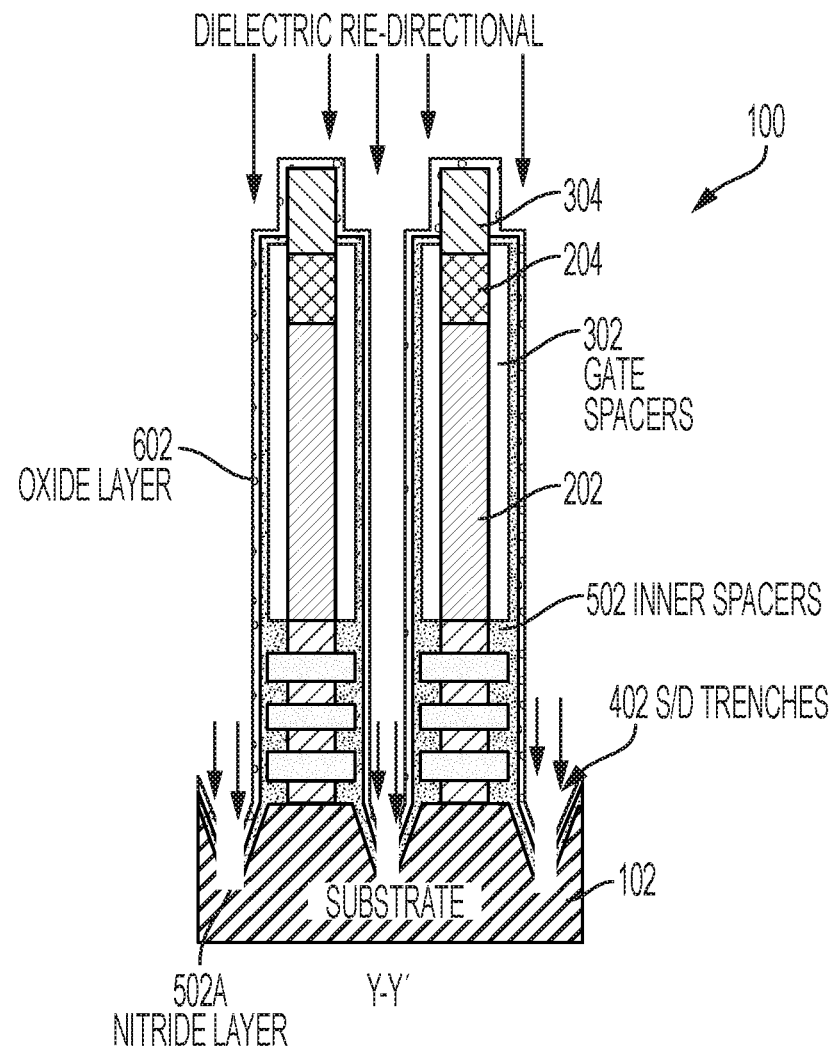

In FIG. 6, known semiconductor fabrication processes have been used to deposit a protective oxide layer 602 on the structure 100 in accordance with aspects of the invention. The protective oxide layer can be formed by a conformal deposition, for example, atomic layer deposition (ALD), plasma enhanced ALD (PEALD), or a combination thereof. In embodiments of the invention, the protective oxide layer 602 can have a thickness in a range of about 1 nm to about 5 nm, or about 2 nm to about 3 nm, although other thicknesses are also contemplated. In embodiments of the invention, the protective oxide layer 602 can be made of other dielectric materials, including, but not limited to, silicon oxycarbide (SiOC), silicon oxynitride (SiON), or a combination thereof, where the protective oxide layer 602 can be selectively etched relative to the hard masks 304, 204 and the offset gate spacers 302.

In FIG. 6, known semiconductor fabrication operations have also been used to open portions of the faceted inner sidewalls of the S/D trenches 402. In embodiments of the invention, the known semiconductor fabrication operations include applying an anisotropic directional dielectric RIE to the structure 100. In embodiments of the invention, because the dielectric RIE is directional, portions of the protective oxide layer 602 and the underlying nitride layer 502A that are substantially parallel with respect to the ion beam that performs the directional dielectric RIE are not etched, while portions of the protective oxide layer 602 and the underlying nitride layer 502A that are substantially non-parallel with respect to the ion beam can be removed. While portions of the dielectric layers 602, 502A in the trenches 402 can be removed, other portions of the dielectric layers 602, 502A at the edges of the sidewalls of the trenches 402 can remain to form downward-spiked ridges (formed from the dielectric layers 602, 502A) around the rim of the S/D trenches 402.

Figure 7:
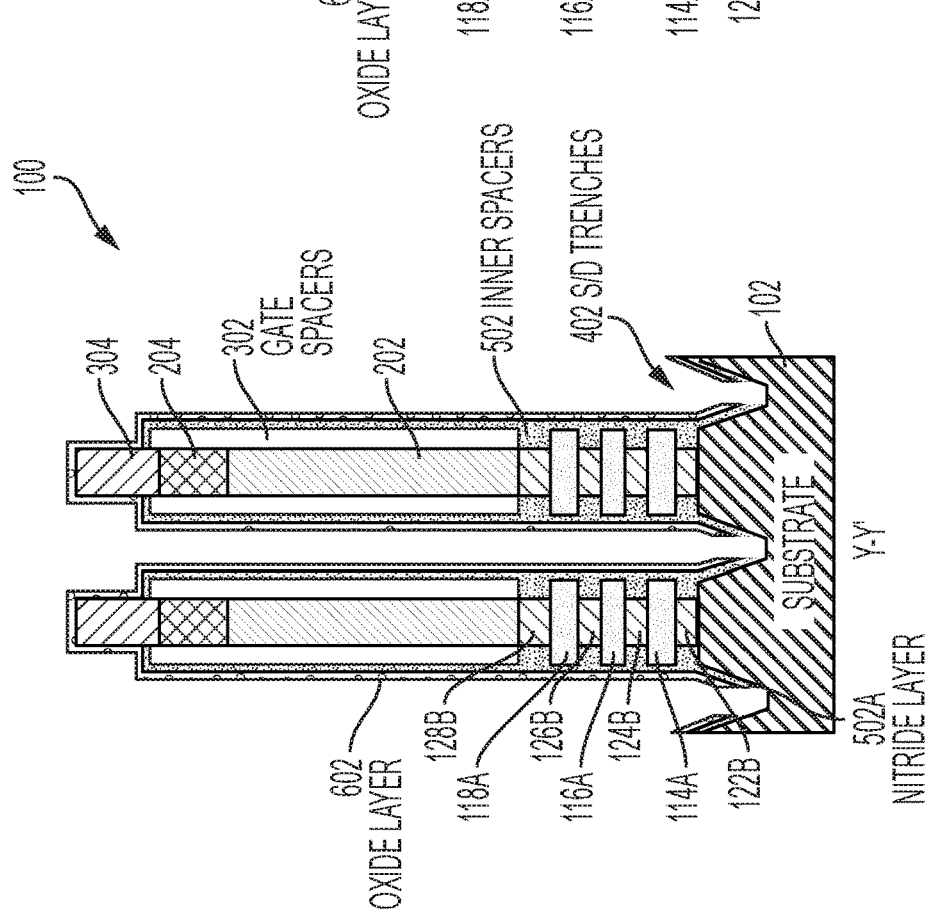

In FIG. 7, known semiconductor fabrication operations have been used to selectively etch the underlying nitride layer 502A to further open up (and/or deepen) the S/D regions 402. In embodiments of the invention, the nitride layer 502A can be selectively etched using a wet process that includes the application of hot phosphoric acid.

Figure 8:
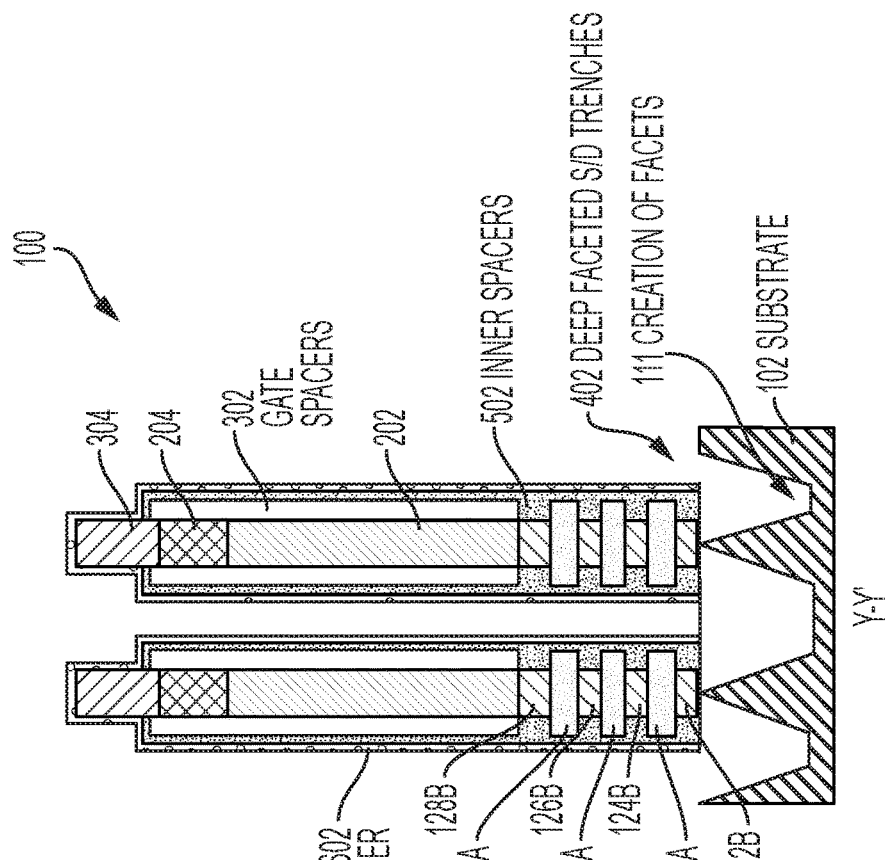

In FIG. 8, known semiconductor fabrication operations have been used to further recess sidewalls of the S/D trenches 402. In embodiments of the invention, sidewalls of the S/D trenches 402 can be extended into the substrate 102 by additional distances in a range of about 20 nm to about 50 nm. In embodiments of the invention, the known semiconductor fabrication operations can include applying a recess process configured to recess the substrate 102 selective to the sacrificial nanosheets 122B, 124B, 126B, 128B. In embodiments of the invention where the substrate 102 is Si and the sacrificial nanosheets 122B, 124B, 126B, 128B are SiGe, ammonia can be used to selectively etch the SiGe sacrificial nanosheets 122B, 124B, 126B, 128B with respect to the Si substrate 102. The etch selectivity of ammonia with respect to SiGe35% in comparison to Si is about 10:1. In some embodiments of the invention, the known fabrication operations can include the use of known and commercially available dry isotropic etch processes that are selective to the SiGe material of the sacrificial nanosheets 122B, 124B, 126B, 128B over dielectrics.

In FIG. 9, know fabrication operations have been used to form counter-doped isolation barrier regions 1202 in the S/D trenches 402 (shown in FIG. 8). In embodiments of the invention, the counter-doped isolation barrier regions 1202 are counter-doped in that the majority charge carriers in the barrier regions 1202 are the opposite of the majority carriers in the S/D regions 1102 (shown in FIG. 8) of the final nanosheet FET. In other words, if the S/D regions 1102 in the final nanosheet FET are doped such that the S/D regions 1102 are p-type, the barrier regions 1202 are formed from a semiconductor material that has been doped such that the barrier regions 1202 are n-type. Likewise, if the S/D regions 1102 in the final nanosheet FET are doped such that the S/D regions 1102 are n-type, the barrier regions 1202 are formed from a semiconductor material that has been doped such that the barrier regions 1202 are p-type. Accordingly, the counter-doped isolation barrier regions 1202 are configured and arranged to electrically isolate the transistor substrate 102 such that unwanted leakage currents from the S/D regions 1102 into the substrate 102 are substantially prevented.

In embodiments of the invention, the counter-doped isolation barrier regions 1202 can be fabricated by using an epitaxial growth process with in-situ doping. Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) can be doped during deposition (in-situ doped) by adding dopants, n-type dopants (e.g., phosphorus or arsenic) or p-type dopants (e.g., boron or gallium), depending on the type of transistor.

The terms "epitaxial growth and/or deposition" and "epitaxially formed and/or grown" mean the growth of a semiconductor material (crystalline material) on a deposition surface of another semiconductor material (crystalline material) in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a <100> orientated crystalline surface will take on a <100> orientation. In some embodiments of the invention, epitaxial growth and/or deposition processes are selective to forming on semiconductor surface, and generally do not deposit material on exposed surfaces, such as silicon dioxide or silicon nitride surfaces.

In FIG. 9, known semiconductor fabrication operations have been used to form faceted S/D regions 1102. In embodiments of the invention, the faceted S/D regions 1102 are formed using an epitaxial layer growth process on the exposed ends of the channel nanosheets 114A, 116A, 118A. In-situ doping is applied to dope the S/D regions 1102, thereby creating the necessary junctions in the nanosheet-based structure 100 that will allow it to function as a final nanosheet FET device. Virtually all semiconductor transistors are based on the formation of junctions. Junctions are capable of both blocking current and allowing it to flow, depending on an applied bias. Junctions are typically formed by placing two semiconductor regions with opposite polarities into contact with one another. The most common junction is the p-n junction, which consists of a contact between a p-type piece of silicon, rich in holes, and an n-type piece of silicon, rich in electrons. N-type and p-type FETs are formed by implanting different types of dopants to selected regions of the device to form the necessary junction(s). N-type devices can be formed by implanting arsenic (As) or phosphorous (P), and p-type devices can be formed by implanting boron (B).

After the fabrication operations depicted in FIG. 9, known semiconductor fabrication operations are used to remove the dummy gate 202 and hard masks 204, 304. In embodiments of the invention, the dummy gate 202 and the hard masks 204, 304 can be removed using, for example, a known etching process, e.g., RIE or chemical oxide removal (COR). Additionally, known semiconductor fabrication operations have been used to remove the sacrificial nanosheet regions 122B, 124B, 126B, 128B. In embodiments of the invention, the sacrificial nanosheet regions 122B, 124B, 126B, 128B can be removed by applying a selective etch (e.g., a hydrochloric acid (HCl)). The nanosheet-based structure 100 is now ready for the application of fabrication processes to replace the removed dummy gate 202 and the hard masks 204, 304 with a multi-segmented gate stack structure, which can include a relatively thin (e.g., from about 0.1 nm to about 2 nm) gate dielectric around the channel nanosheets 114A, 116A, 118A, a work function metal around the gate dielectric and the channel nanosheets 114A, 116A, 118A, and a primary metal region above the topmost channel nanosheet 118A between the gate spacers 302.

FIGS. 10-11 depict nanosheet-based structures 100A after various fabrication operations for forming nanosheet FETs having a barrier scheme for electrically isolating the substrate 102 from the S/D regions 1102 (shown in FIG. 9) in accordance with aspects of the invention. In embodiments of the invention as represented by the nanosheet-based structures 100A, the barrier scheme is provided by a single counter-doped isolation barrier region 1202A (shown in FIG. 11) formed in the substrate 102 in the regions of the substrate 102 over which the bottommost channel nanosheet 114A and the S/D regions 1102 (shown in FIG. 9) will be formed. The barrier region 1202A is counter-doped in that the majority charge carriers in the barrier region 1202A are the opposite of the majority carriers in the S/D regions 1102 of the final nanosheet FET. In other words, if the S/D regions 1102 in the final nanosheet FET are doped such that the S/D regions 1102 are p-type, the barrier region 1202A is doped such that the barrier region 1202A is n-type. Likewise, if the S/D regions 1102 in the final nanosheet FET are doped such that the S/D regions 1102 are n-type, the barrier region 1202A is doped such that the barrier region 1202A is p-type. Accordingly, the counter-doped barrier region 1202A is configured and arranged to electrically isolate the transistor substrate 102 such that unwanted leakage currents from the S/D regions 1102 into the substrate 102 are substantially prevented.

In FIG. 10, known fabrication operations have been used to fabrication the nanosheet-based structure 100A. More specifically, in embodiments of the invention, substantially the same fabrication operations depicted in FIGS. 1A through 8 have been used to fabricate the nanosheet-based structure 100A, except that in FIG. 10, the semiconductor fabrication operations used in FIG. 8 have been used in FIG. 10 to further recess sidewalls of the S/D trenches 402 (shown in FIG. 7) to form a S/D trench 402A that, in addition to being positioned in regions of the substrate 102 over which the S/D regions 1102 (shown in FIG. 9) will be formed, also extends completely under the channel nanosheet stack formed by channel nanosheets 114A, 116A, 118A. For ease of illustration, the S/D trench 402A is large enough to cover two structures that will become two final nanosheet-based FET devices. However, in embodiments of the invention, the S/D trench 402A can be large enough to cover any number of final nanosheet-based FET devices. In embodiments of the invention, the known semiconductor fabrication operations can include applying a recess process configured to recess the substrate 102 selective to the sacrificial nanosheets 122B, 124B, 126B, 128B. In embodiments of the invention where the substrate 102 is Si and the sacrificial nanosheets 122B, 124B, 126B, 128B are SiGe, ammonia can be used to selectively etch the SiGe sacrificial nanosheets 122B, 124B, 126B, 128B with respect to the Si substrate 102. The etch selectivity of ammonia with respect to SiGe35% in comparison to Si is about 10:1. In some embodiments of the invention, the known fabrication operations can include the use of known and commercially available dry isotropic etch processes that are selective to the SiGe material of the sacrificial nanosheets 122B, 124B, 126B, 128B over dielectrics.

In FIG. 11, know fabrication operations have been used to form a counter-doped isolation barrier region 1202A in the S/D trench 402A (shown in FIG. 10). In embodiments of the invention, the counter-doped isolation barrier region 1202A is counter-doped in that the majority charge carriers in the barrier region 1202A are the opposite of the majority carriers in the S/D regions 1102 (shown in FIG. 9) of the final nanosheet FET. In other words, if the S/D regions 1102 in the final nanosheet FET are doped such that the S/D regions 1102 are p-type, the barrier region 1202A is formed from a semiconductor material that has been doped such that the barrier region 1202A is n-type. Likewise, if the S/D regions 1102 in the final nanosheet FET are doped such that the S/D regions 1102 are n-type, the barrier region 1202A is formed from a semiconductor material that has been doped such that the barrier region 1202A is p-type. Accordingly, the counter-doped isolation barrier region 1202A is configured and arranged to electrically isolate the transistor substrate 102 such that unwanted leakage currents from the S/D regions 1102 into the substrate 102 are substantially prevented.

After the fabrication operations depicted in FIG. 11, the same known semiconductor fabrication operations described above in connection with FIG. 9 are used to finalize the nanosheet-based FET devices, thereby forming nanosheet-based FET devices in accordance with aspects of the invention.

FIG. 12 depicts a nanosheet-based structure 100B after various fabrication operations for forming nanosheet FETs having a barrier scheme for electrically isolating the substrate 102 from the S/D regions 1102 (shown in FIG. 9) in accordance with aspects of the invention. In embodiments of the invention as represented by the nanosheet-based structure 100B, the barrier scheme is provided by a doped isolation barrier layer 1302 formed on sidewalls of the S/D trenches 402B. In FIG. 12, known fabrication operations have been used to fabrication the nanosheet-based structure 100B. More specifically, in embodiments of the invention, substantially the same fabrication operations depicted in FIGS. 1A through 7 have been used to fabricate the nanosheet-based structure 100B, except that in FIG. 12, after the semiconductor fabrication operations used in FIG. 7, the doped isolation barrier layer 1302 is formed on sidewalls of the S/D trenches 402B. In embodiments of the invention, the doped isolation barrier layer 1302 can be formed on sidewalls of the S/D trenches 402B by ion implantation into the sidewalls of the S/D trenches 402B. In accordance with aspects of the invention, the doped isolation barrier layer 1302 provides electrical isolation in the following manner. The layer/region 1302 has opposite polarity to the polarity of the S/D regions (e.g., S/D regions 1102 shown in FIG. 9). The substrate 102 can be lightly p-type (e.g., the substrate 102 can be Si having an initial impurity doping concentration between 1013 and 1016 atoms per cm3) so implanting sufficient As (e.g., at doping levels of 1016 or greater) will convert that portion of the substrate 102 to n-type, which will create a PN junction between the S/D regions and the substrate 102, with p being the S/D region and n being the new region, which will prohibit the current from flowing back into the substrate 102. Furthermore the layer/region 1302 is now opposite to the substrate 102, which creates an interruption to the p+p region by implanting n-type doping. In embodiments of the invention, arsenic (As) can be implanted into the substrate 102. A directional implantation, for example, ion beam implantation of arsine ($AsH_3$), can be used to implant the atomic species. In embodiments of the invention, the doped isolation barrier layer 1302 formed by ion implantation can have a thickness in a range of about 2 nm to about 10 nm, where the thickness can vary depending on the implantation process used.

After the fabrication operations depicted in FIG. 14, the same known semiconductor fabrication operations described above in connection with FIG. 11 are used to finalize the nanosheet-based FET devices.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the detailed description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

As previously noted herein, for the sake of brevity, conventional techniques related to semiconductor device and IC fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of fabricating a nanosheet field effect transistor (FET), the method comprising:
   forming a stack of channel nanosheets over a substrate;
   forming a source or drain (S/D) trench in a predetermined region of the substrate;
   wherein the predetermined region of the substrate comprises a region over which a S/D region of the nanosheet FET will be formed;
   wherein the S/D region of the nanosheet FET will be formed at ends of a bottommost one of the stack of channel nanosheets; and
   forming an isolation barrier in the S/D trench;
   wherein the isolation barrier comprises a doped semiconductor material and is configured to substantially prevent the S/D region from being electrically coupled to the substrate.

2. The method of claim 1, wherein:
   the doped semiconductor material comprises positively charged majority carriers; and
   the S/D region will comprise negatively charged majority carriers.

3. The method of claim 1, wherein:
   the doped semiconductor material comprises negatively charged majority carriers; and
   the S/D region will comprise positively charged majority carriers.

4. The method of claim 1, wherein forming the isolation barrier comprises forming the doped semiconductor material in the S/D trench.

5. The method of claim 4, wherein forming the doped semiconductor material comprises epitaxially growing the doped semiconductor material in the S/D trench.

6. The method of claim 5, wherein:
   the doped semiconductor material comprises positively charged majority carriers; and
   the S/D region will comprise negatively charged majority carriers.

7. The method of claim 5, wherein:
   the doped semiconductor material comprises negatively charged majority carriers; and
   the S/D region will comprise positively charged majority carriers.

8. The method of claim 1, wherein forming the isolation barrier comprises implanting dopants through sidewalls of the S/D trench.

9. The method of claim 1, wherein sidewalls of the S/D trench comprise (111) facets.

10. A nanosheet field effect transistor (FET) device comprising:
    a stack of channel nanosheets over a substrate;
    a source or drain (S/D) trench in a predetermined region of the substrate;
    wherein the predetermined region of the substrate comprises a region over which a S/D region of the nanosheet FET is formed;
    wherein the S/D region of the nanosheet FET is formed at ends of a bottommost one of the stack of channel nanosheets; and an isolation barrier in the S/D trench;
wherein the isolation barrier comprises a doped semiconductor material and is configured to substantially prevent the S/D region from being electrically coupled to the substrate.

11. The device of claim 10, wherein:
the doped semiconductor material comprises positively charged majority carriers; and
the S/D region will comprise negatively charged majority carriers.

12. The device of claim 10, wherein:
the doped semiconductor material comprises negatively charged majority carriers; and
the S/D region will comprise positively charged majority carriers.

13. The device of claim 10, wherein the isolation barrier comprises the doped semiconductor material in the S/D trench.

14. The device of claim 13, wherein the doped semiconductor material comprises epitaxially grown doped semiconductor material.

15. The device of claim 14, wherein:
the doped semiconductor material comprises positively charged majority carriers; and
the S/D region will comprise negatively charged majority carriers.

16. The device of claim 14, wherein:
the doped semiconductor material comprises negatively charged majority carriers; and
the S/D region will comprise positively charged majority carriers.

17. The device of claim 10, wherein the isolation barrier comprises a layer of dopants implanted through sidewalls of the S/D trench.

18. The device of claim 10, wherein sidewalls of the S/D trench comprise (111) facets.

* * * * *